(12) United States Patent
Kelberlau et al.

(10) Patent No.: US 6,259,123 B1
(45) Date of Patent: Jul. 10, 2001

(54) HIGH VOLTAGE POWER MOS DEVICE

(76) Inventors: Ulrich Kelberlau, Roemerstr. 113d, 68623 Lampertheim (DE); Nathan Zommer, 989 Covington Rd., Los Altos, CA (US) 94024

( * ) Notice: Subject to any disclaimer, the term of this patent is extended or adjusted under 35 U.S.C. 154(b) by 0 days.

(21) Appl. No.: 09/111,151

(22) Filed: Jul. 6, 1998

Related U.S. Application Data

(62) Division of application No. 08/706,513, filed on Sep. 4, 1996, now Pat. No. 5,851,857.

(51) Int. Cl.[7] .................................................. H01L 21/332
(52) U.S. Cl. ......................... 257/107; 257/110; 257/499; 257/565; 438/133; 438/134
(58) Field of Search .................................. 438/133, 134, 438/135; 257/499, 500, 502, 213, 258, 107, 110, 120, 565

(56) References Cited

U.S. PATENT DOCUMENTS

| | | | |
|---|---|---|---|
| 4,066,484 | 1/1978 | Moyson | 438/139 |
| 4,564,855 | 1/1986 | Van Zanten | 257/568 |
| 5,171,696 | 12/1992 | Hagino | 438/139 |
| 5,528,058 | * 6/1996 | Peng, Jr. et al. | |

OTHER PUBLICATIONS

Baliga, B. Jayant et al., "The Insulated Gate Transistor: A New Three–Terminal MOS–Controlled Bipolar Power Device," *IEEE Transactions on Electron Devices* (Jun. 1984) Ed—31 (6) :821–828.

Chow, T.P. et al., "Comparison of 300–, 600–, and 1200—V n—Channel Insulated Gate Transistors," *IEEE Electron Device Letters* (Apr. 1985) EDL—6(4) :161–163.

* cited by examiner

*Primary Examiner*—Kevin M. Picardat
*Assistant Examiner*—D. M. Collins
(74) *Attorney, Agent, or Firm*—Townsend and Townsend and Crew LLP

(57) ABSTRACT

A switching device is described having a semiconductor substrate with a front side and a back side. The switching device includes a first transistor which includes a first region adjacent the front side, a second region within the first region, the semiconductor substrate, and at least one island region adjacent the backside. The switching device also includes a second transistor which includes the first region, the second region, the semiconductor substrate, and a third region coupled to the at least one island region.

21 Claims, 2 Drawing Sheets

HIGH VOLTAGE POWER MOS DEVICE

This application is a division of and claims the benefit of U.S. application Ser. No. 08/706,513, filed Sep. 4, 1996, U.S. Pat. No. 5,851,857 the disclosure of which is incorporated by reference.

BACKGROUND OF THE INVENTION

The present invention relates to power switching devices. More specifically, the present invention relates to a power switching device for high frequency applications which has a relatively low "on resistance."

Metal-oxide semiconductor field effect transistors (MOSFETs) have become the standard power switching device because of their fast switching capabilities. Unfortunately, as the breakdown voltages of power MOSFETs increase, a correlative increase in device "on resistance," $R_{ON}$, is encountered. This undesirable increase is largely a result of the high resistivity of the semiconductor layer which makes the increase in breakdown voltage possible. Increased $R_{ON}$, in turn, translates into conduction losses and increasingly inefficient operation. The relationship between $R_{ON}$ and the device breakdown voltage, $V_B$, is approximated by the equation:

$$R_{ON} \approx aV_B^{2.5} \quad (1)$$

That is, for every doubling of $V_B$, $R_{ON}$ is increased by a factor of 5.66. Thus, despite their favorable switching characteristics, at some breakdown voltage, standard power MOSFETs become too inefficient for high power operation.

In contrast, insulated gate bipolar transistors (IGBTs) have a lower effective RON than MOSFETs as a result of a four layer structure which facilitates the injection of minority carriers into the high resistivity region. Unfortunately, the injection of these minority carriers results in slower devices which cannot match the switching capabilities of MOSFETs. This is due to the delay required to build up enough minority carriers in the high resistivity region before an IGBT is fully turned on. Similarly, the IGBT experiences a delay turning off because of the time required for the same minority carriers to be removed from this region.

In addition, because the four layer structure of an IGBT is similar to that of a thyristor, if the concentration of minority carriers in the high resistivity region exceeds a certain threshold, the IGBT ceases to behave like a transistor and goes into a latching mode. This behavior is described in detail in U.S. Pat. No. 4,199,774, issued on Apr. 22, 1980, the entire specification of which is incorporated herein by reference. Several techniques have been employed to reduce the susceptibility of IGBTs to latching. One of the most effective techniques involves irradiating the device with electrons after completion of standard semiconductor processing. Other techniques include unique device cell layout, source ballasting, and increasing the doping of the body region of the device. For more detailed descriptions of some of these techniques please see Comparison of 300-, 600-, and 1200-V n-Channel Insulated Gate Transistors, Chow et al., IEEE Transactions on Electron Device Letters, Vol. EDL-6, No. 4, April 1985, pp. 161–163, and The Insulated Gate Transistor: A New Three-Terminal MOS-Controlled Bipolar Power Device, Baliga et al., IEEE Transactions on Electron Devices, Vol. ED-31, No. 6, June 1984, pp. 821–828, both of which are incorporated herein by reference in their entirety. Unfortunately, while these techniques have had varying measures of success in reducing latching susceptibility, the devices remain slower than MOSFETs operating at similar power levels.

A power switching device is therefore desirable which combines the switching speed of a power MOSFET with the low "on resistance" of an IGBT.

SUMMARY OF THE INVENTION

The present invention provides a power switching device which combines the switching speed of a power MOSFET with the low "on resistance" of an IGBT. Moreover, the switching device of the present invention is less susceptible to the above-described latching phenomenon than standard IGBTs. The operational characteristics of the switching device of the present invention are made possible by its unique structure which provides a power MOSFET and an IGBT in parallel in a single device. The devices share a common source/emitter region and a common gate. The drain of the MOSFET comprises a number of island regions adjacent the back side of the device, at which surface the island regions are surrounded by the collector region of the IGBT.

Moreover, by varying the size, shape, number, and alignment of the island drain regions, the operational characteristics of the device of the present invention can be made to be more like either the MOSFET or the IGBT depending upon the application. That is, if in a particular application a fast switching speed is more important than a low "on resistance," the operational characteristics of the device can be adjusted toward the MOSFET end of the spectrum. This may be accomplished, for example, by increasing the size of the island drain regions. Alternatively, a similar effect may be achieved by aligning the island drain regions more closely with the gate of the device.

Thus, according to the invention, a switching device and a method for fabricating the same are provided. The switching device is fabricated in a semiconductor substrate with a front side and a back side. The switching device includes a first transistor which includes a first region adjacent the front side, a second region within the first region, the semiconductor substrate, and at least one island region adjacent the backside. The switching device also includes a second transistor which includes the first region, the second region, the semiconductor substrate, and a third region coupled to the at least one island region.

A further understanding of the nature and advantages of the present invention may be realized by reference to the remaining portions of the specification and the drawings.

DESCRIPTION OF THE PREFERRED EMBODIMENT

Figure 1:
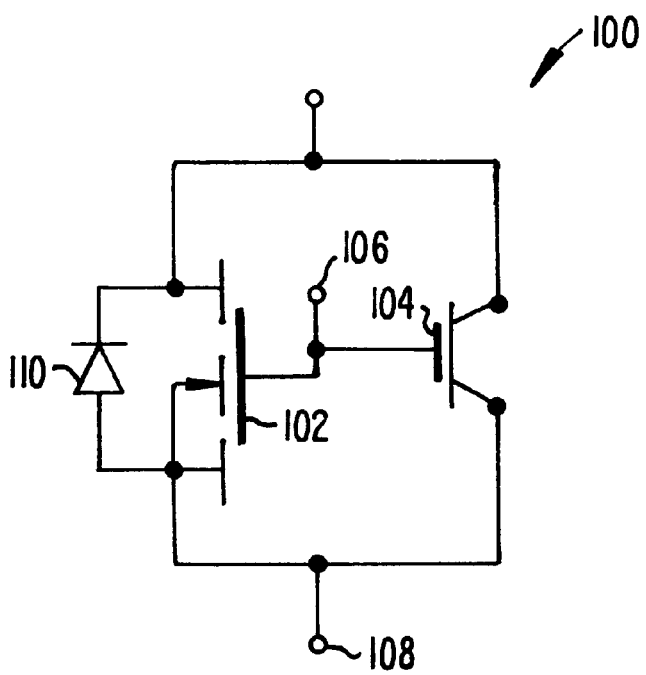
FIG. 1 is a schematic representation of a switching device designed according to the present invention.

FIG. 1 is a schematic representation of a switching device 100 designed according to the present invention. Switching device 100 is an integrated device which includes a power MOSFET 102 and an IGBT 104 connected in parallel. The devices share the same MOS gate 106 and the same region as the source of the MOSFET and the emitter of the IGBT, i.e., source/emitter node 108. Device 100 also includes an intrinsic reversed diode 110 in parallel with both MOSFET 102 and IGBT 104. Intrinsic diode 110 obviates the need for an external diode to be added across IGBT 104 as would typically be the practice.

Figure 2:
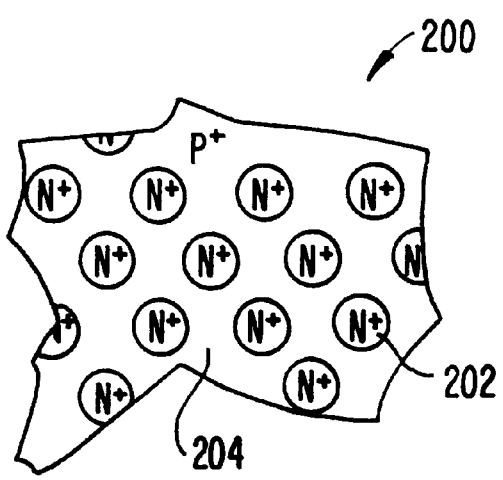
FIG. 2 is a simplified illustration of the backside of a switching device designed according to a specific embodiment of the invention.

FIG. 2 is a simplified illustration of the back side 200 of an N-channel switching device designed according to a specific embodiment of the invention. The substrate of the device is an N-type semiconductor crystal into which N+ island regions 202 are formed. At back side 200, the N+ island regions are surrounded by a P+ doped region. In FIG. 2, island regions 202 are shown as circular. However, according to various embodiments of the invention, these regions may have any of a variety of closed shapes including, for example, ellipses, polygons, triangles, etc. The formation of N+ island regions 202 and the surrounding P+ area 204 may be accomplished sequentially by any of a variety of ion implantation or deposition techniques.

The designer may uniquely determine the operational characteristics of the switching device of the present invention for a particular application by controlling the size, shape, and number of island regions 202. This is because the ratio of the island region area to the total back side area determines whether the device operates more like a MOSFET or an IGBT. This ratio R may be represented:

$$R = nA_i/A_T \qquad (2)$$

where n is the number is island regions, $A_i$ is the area of each individual island region, and $A_T$ is the total area of the back side of the device. According to various embodiments of the invention, the designer may vary the ratio R between 0 and 1. For R=0, the device is a standard IGBT. For R=1, the device is a standard MOSFET (if no P+ back side doping is used). The alignment of island regions 202 also affects the operational characteristics of the device and will be discussed below with reference to FIGS. 3 and 4.

Figure 3:
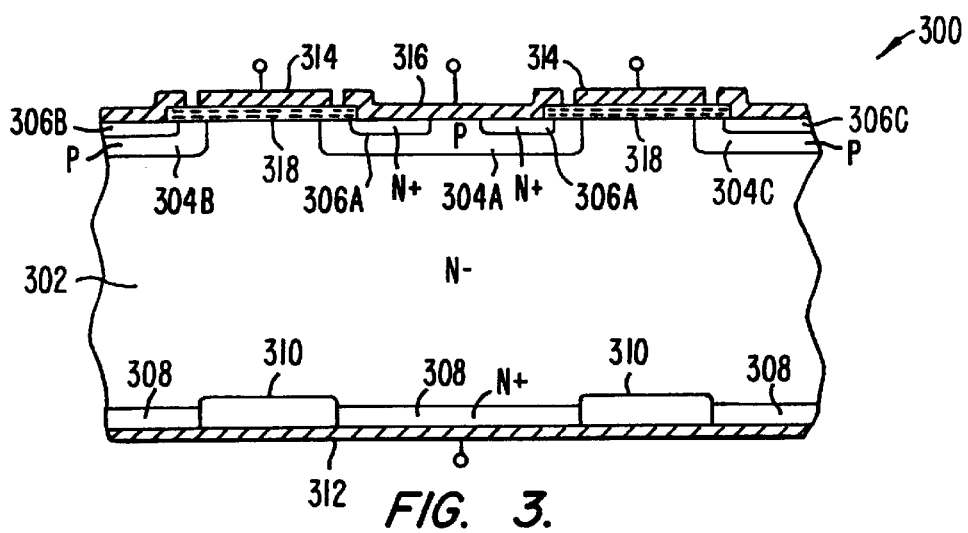
FIG. 3 is a cross-sectional view of a switching device designed according to a specific embodiment of the invention.

FIG. 3 is a cross-sectional view of a switching device 300 designed according to a specific embodiment of the invention. Device 300 is formed in an N− semiconductor crystal 302 with P wells 304 formed in the front side thereof. N+ regions 306 are formed within P wells 304. In the back side of crystal 302 N+ island regions 308 are separated by a continuous P+ region 310. A collector/drain electrode 312 on the back side of crystal 302 electrically connects island regions 308 with region 310. Gate electrode 314 and emitter/source electrode 316 are formed on the front side of crystal 302 with oxide layer 318 separating gate electrode 314 from the surface of crystal 302. Similar device features in subsequent drawings will employ the same reference numbers.

The device features of FIG. 3 combine to form the device of FIG. 1 in the following manner. N+ region 306A, P well 304A, N− crystal 302, and N+ island regions 308 combine to form MOSFET 102. N+ region 306A, P well 304A, N− crystal 302, and P+ region 310 combine to form IGBT 104. Intrinsic diode 110 corresponds to P well 304A, N− crystal 302, and N+ island regions 308. Edge of die termination for each device can be a continuous P+ region in the back side of the device and the corresponding N+ scribe line configuration in a standard MOSFET or IGBT device.

Switching devices made according to the present invention such as, for example, device 300 of FIG. 3, have advantages over conventional MOSFETs and IGBTS. A conventional high voltage MOSFET has a high "on resistance" $R_{ON}$. A typical 1000V MOSFET with an area of 64 mmsq has an $R_{ON}$ of 1 ohm. A 1600V MOSFET with the same die area has an $R_{ON}$ of 3.24 ohms at 25° C. However, as the device heats up, $R_{ON}$ increases. At a junction temperature of 150° C., $R_{ON}$ typically doubles from its rating at 25° C. resulting in an $R_{ON}$ greater than 6 ohms; an unacceptably high value for many applications.

By contrast, and much like the back side P+ region of an IGBT, back side P+ region 310 of switching device 300 injects minority carriers, i.e., "holes," into the N− region of crystal 302, thereby reducing the resistance of the switch. The injection of minority carriers into the high resistivity region represented by the N− region is sufficient to reduce $R_{ON}$ of device 300 without slowing it down overly much. Of course, as discussed above, the designer may manipulate the size, shape, number, and alignment of N+ island regions 308 to increase or decrease the effects of minority carrier injection to suit a particular application. An example of such manipulation is described with reference to FIG. 4.

Figure 4:
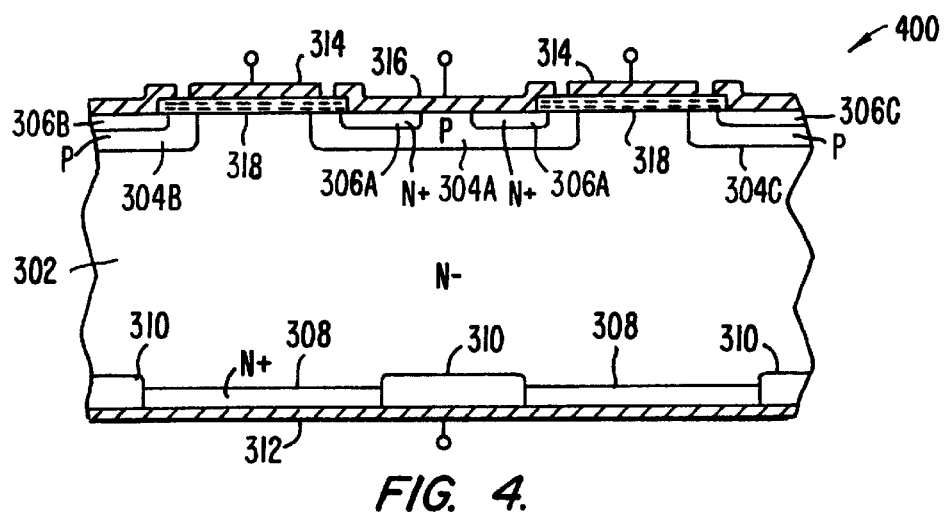
FIG. 4 is a cross-sectional view of a switching device designed according to another specific embodiment of the invention.

FIG. 4 is a cross-sectional view of a switching device 400 designed according to another specific embodiment of the invention. Switching device 400 is similar to device 300 except that P+ region 310 is aligned with P wells 304 rather than gate electrode 314. This configuration results in greater minority carrier injection, and thus device 400 acts more like an IGBT than device 300. Conversely, the configuration of device 300 in which P+ region 310 is aligned with gate electrode 314 results in lesser minority carrier injection, and thus device 300 acts more like a MOSFET.

In yet another alternate embodiment, the spacing of regions 308 and 310 differs from those of P wells 304 such that no particular alignment occurs. Where precise control over the operational characteristics of the device is desired, the coincident spacing of device 300 or 400 is preferable to a device in which no such alignment may be accomplished. However, it is easier (and therefore cheaper) to manufacture a device without such alignment requirements. Thus, where a wider range of operational characteristics is acceptable, it is not necessary to require alignment of these device features.

The intrinsic diode formed in each of the above devices (i.e., diode 110 of FIG. 1) can be made a fast switching diode by one or a combination of several techniques. For example, the device may be irradiated with a high energy, i.e., greater than 2 mega electron volts (MEV), electron beam. "Deep traps" may also be incorporated in the device crystal by implantation, deposition, or evaporation followed by diffusion of heavy metal atoms such as, for example, gold and platinum. The diffusion step may employ conventional techniques or a rapid thermal process (RTP). Additionally, high energy implantation of ions such as, for example, He+ ions, or "alpha particles." Any irradiation damage caused by any of these techniques may require a controlled anneal step for correction of the damage.

Figure 5:
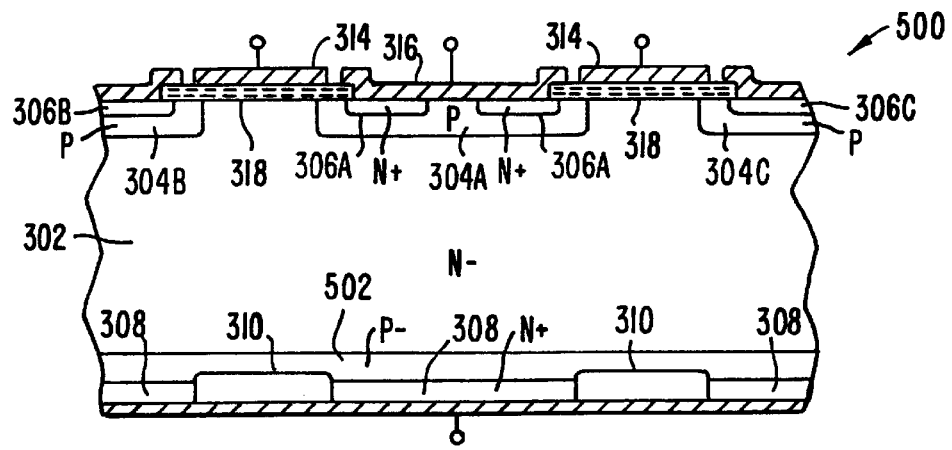
FIG. 5 is a cross-sectional view of a switching device designed according to yet another specific embodiment of the invention.

Even with the use of the above-described techniques to speed up the intrinsic diode, there are some applications for which it is too slow. Therefore, it may be desirable to block it off from operation. This may be accomplished by the formation of a P− layer 502 as shown in FIG. 5. Switching device 500 is substantially identical to switching device 300 of FIG. 3 except for the introduction of P− layer 502 which blocks the intrinsic diode by isolating N+ island regions 308 from the N− region of crystal 302. The effectiveness of the blocking is dependent, at least in part, on the net width of layer 502. In addition, the doping concentration of layer 502 must be carefully controlled to ensure that sufficient hole injection by P+ region 310 will still occur, and that there is effective "emitter shorting" in the back side of the device by N+ island regions 308. One method of forming layer 502 which facilitates achieving these goals employs an ion implantation and diffusion process. Following implantation in the back side of the N− crystal, the diffusion step brings P− layer 502 relatively deep within crystal 302 as compared to the diffusion depths of the front side regions 304 and 306. If the doping concentration is relatively high and the net width of layer 502 is greater than about 5 microns, device 500 will tend to behave somewhat like a typical IGBT with a low $V_{SAT}$ (e.g., 2V) and a relatively slow turn-off time (500 ns). For relatively low doping concentrations and net widths less than 5 microns, device 500 will have a greater $V_{SAT}$ (e.g., 2.3–6V) and a much faster turn-off time (e.g., 50 ns), behaving more like device 300 of FIG. 3.

One method for forming the back side structure of FIG. 5 includes the following steps:

1. Backside implantation of a low dose of boron for creation of P− layer.
2. High temperature (T>1100° C.) diffusion for longer than 12 hours to drive the boron to a depth of greater than 6 microns.
3. Masking and etching of back side to define openings for introduction of impurities for formation of N+ island regions.
4. Introduction of a high dose of N+ impurities (e.g., >1E15) either by ion implantation or by standard diffusion pre-deposition process to form N+ island regions.
5. Etching of the remaining back side oxide.
6. Deposition of boron either by ion implantation or diffusion pre-deposition. The relative concentrations of the boron and the N+ doping in the island regions are such that the N+ regions are not converted to P regions.
7. Diffusion of boron at T<1150° C. for less than 9 hours, the specific temperature and diffusion time of course being dependent upon the desired device characteristics. The shallower the diffusion, the higher the $V_{SAT}$ and the faster the device. For example, for depths of less than 5 microns for both the N+ island regions and the P+ backside region, $V_{SAT} \approx 3-4V$ and the device turn-off time is approximately 200 ns. It will be understood that the order of formation of the N+ island regions and the P+ back side region may be reversed.

While the invention has been particularly shown and described with reference to specific embodiments thereof, it will be understood by those skilled in the art that the foregoing and other changes in the form and details may be made therein without departing from the spirit or scope of the invention. For example, the present invention has been described primarily with regard to an N-channel device. However, it will be understood that the invention may just as easily be implemented as a P-channel device with complementary doped regions and substrate. The scope of the invention should therefore be determined by reference to the appended claims.

What is claimed is:

1. A switching device, comprising:
    a semiconductor substrate having a front side and a back side;
    a first transistor comprising a first region adjacent the front side, a second region within the first region, the semiconductor substrate, and at least one island region adjacent the back side; and
    a second transistor comprising the first region, the second region, the semiconductor substrate, and a third region coupled to the at least one island region.

2. The switching device of claim 1 wherein the first region and the semiconductor substrate form an intrinsic diode in parallel with the first and second transistors.

3. The switching device of claim 2 further comprising a fourth region adjacent the third region and the at least one island region for blocking operation of the intrinsic diode.

4. The switching device of claim 1 wherein the at least one island region is aligned with the first region.

5. The switching device of claim 1 wherein the at least one island region is aligned with a gate region.

6. The switching device of claim 1 wherein the semiconductor substrate, the second region and the at least one island region comprise N-type regions and the first and third regions comprise P-type regions.

7. The switching device of claim 1 wherein the semiconductor substrate, the second region and the at least one island region comprise P-type regions and the first and third regions comprise N-type regions.

8. A switching device, comprising:
    a semiconductor substrate of a first conductivity type having a front side and a back side;
    a first region of a second conductivity type in the semiconductor substrate adjacent the front side;
    a second region of the first conductivity type within the first region and adjacent the front side;
    a plurality of island regions of the first conductivity type adjacent the back side; and
    a third region of the second conductivity type adjacent the back side, the third region being coupled to the island regions;
    wherein the first region, the second region, the semiconductor substrate, and the island regions form a first transistor, and wherein the first region, the second region, the semiconductor substrate, and the third region form a second transistor in parallel with the first transistor.

9. The switching device of claim 8 wherein the first region and the semiconductor substrate form an intrinsic diode in parallel with the first and second transistors.

10. The switching device of claim 9 further comprising a fourth region adjacent the third region and the island regions for blocking operation of the intrinsic diode.

11. The switching device of claim 8 wherein at least one of the island regions is aligned with the first region.

12. The switching device of claim 8 wherein at least one of the island regions is aligned with a gate region.

13. The switching device of claim 8 wherein regions of the first conductivity type comprise N-type regions and regions of the second conductivity type comprise P-type regions.

14. The switching device of claim 8 wherein regions of the first conductivity type comprise P-type regions and regions of the second conductivity type comprise N-type regions.

15. A switching device, comprising:
    a substrate of a first conductivity type having a first side and a second side;
    a first transistor including:
        a first region of a second conductivity type provided adjacent the first side of the substrate,
        a second region of the first conductivity type provided within the first region, and
        at least one island region provided adjacent the second side of the substrate; and
    a second transistor including:
        the first region of the second conductivity type provided adjacent the first side, and
        a third region of the second conductivity provided adjacent the second side defining the at least one island region.

16. The switching device of claim 15, further comprising:
a first electrode provided adjacent to the first side and coupled to the first and second regions.

17. the switching device of claim 16, wherein the first electrode is a source/emitter electrode.

18. The switching device of claim 16, further comprising:
a second electrode provided adjacent to the second side and coupled to the at least one island region and the third region.

19. The switching device of claim 18, wherein the second electrode is a collector/drain electrode.

20. The switching device of claim 18, wherein there are a plurality of island regions.

21. The switching device of claim 15, wherein there are a plurality of island regions.

* * * * *